(12) United States Patent
Sarpatwari et al.

(10) Patent No.: US 11,783,902 B2
(45) Date of Patent: *Oct. 10, 2023

(54) MULTI-STATE PROGRAMMING OF MEMORY CELLS

(71) Applicant: Micron Technology, Inc., Boise, ID (US)

(72) Inventors: Karthik Sarpatwari, Boise, ID (US); Nevil N. Gajera, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/709,102

(22) Filed: Mar. 30, 2022

(65) Prior Publication Data

US 2022/0223212 A1 Jul. 14, 2022

Related U.S. Application Data

(63) Continuation of application No. 16/993,831, filed on Aug. 14, 2020, now Pat. No. 11,295,822.

(51) Int. Cl.
*G11C 11/34* (2006.01)
*G11C 16/34* (2006.01)
(Continued)

(52) U.S. Cl.
CPC .......... *G11C 16/3404* (2013.01); *G11C 16/10* (2013.01); *G11C 16/26* (2013.01); *G11C 16/30* (2013.01); *G11C 16/32* (2013.01)

(58) Field of Classification Search
CPC ......... G11C 16/10; G11C 16/30; G11C 16/12; G11C 16/0483; H01L 27/115
(Continued)

(56) References Cited

U.S. PATENT DOCUMENTS 7,843,740 B2 * 11/2010 Fujiki ................... H01L 29/792
365/185.26
10,102,891 B2 10/2018 Tortorelli et al.
(Continued)

FOREIGN PATENT DOCUMENTS

KR 10-2017-0056242 A 5/2017

OTHER PUBLICATIONS

U.S. Appl. No. 16/729,731, entitled, "Three-State Programming of Memory Cells", filed Dec. 30, 2019, 35 pages.
(Continued)

*Primary Examiner* — Son T Dinh
(74) *Attorney, Agent, or Firm* — Brooks, Cameron & Huebsch, PLLC (57) ABSTRACT

The present disclosure includes apparatuses, methods, and systems for multi-state programming of memory cells. An embodiment includes a memory having a plurality of memory cells, and circuitry configured to program a memory cell of the plurality of memory cells to one of four possible data states by applying a first voltage pulse to the memory cell wherein the first voltage pulse has a first polarity and a first magnitude, and applying a second voltage pulse to the memory cell wherein the second voltage pulse has a second polarity and a second magnitude, and the second voltage pulse is applied for a shorter duration than the first voltage pulse.

18 Claims, 6 Drawing Sheets

(51) Int. Cl.
    *G11C 16/10* (2006.01)
    *G11C 16/32* (2006.01)
    *G11C 16/30* (2006.01)
    *G11C 16/26* (2006.01)

(58) Field of Classification Search
    USPC .................................... 365/185.18, 185.19
    See application file for complete search history.

(56) References Cited

U.S. PATENT DOCUMENTS

| | | |
|---|---|---|
| 10,163,506 B2 | 12/2018 | Pirovano et al. |
| 10,381,075 B2 | 8/2019 | Totorelli et al. |
| 10,546,632 B2 | 1/2020 | Redaelli et al. |
| 11,295,822 B2* | 4/2022 | Sarpatwari ......... G11C 13/0004 |
| 2013/0094275 A1 | 4/2013 | Chen |
| 2014/0056053 A1 | 2/2014 | Ramaswamy et al. |
| 2017/0047118 A1 | 2/2017 | Castro |
| 2017/0139628 A1 | 5/2017 | Yoon et al. |
| 2017/0221562 A1 | 8/2017 | Buchanan |
| 2020/0066343 A1 | 2/2020 | Castro et al. |

OTHER PUBLICATIONS

U.S. Appl. No. 16/729,787, entitled, "Multi-State Programming of Memory Cells", filed Dec. 30, 2019, 48 pages.
International Search Report and Written Opinion from related International Patent Application No. PCT/US2021/045537, dated Dec. 2, 2021, 9 pages.

* cited by examiner

MULTI-STATE PROGRAMMING OF MEMORY CELLS

PRIORITY INFORMATION

This application is a Continuation of U.S. application Ser. No. 16/993,831, filed on Aug. 14, 2020, which will issue as U.S. Pat. No. 11,295,822 on Apr. 5, 2022, the contents of which are incorporated herein by reference.

TECHNICAL FIELD

The present disclosure relates generally to semiconductor memory and methods, and more particularly, to multi-state programming of memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells may be programmed to store data corresponding to a target data state by varying the resistance level of the memory element. Resistance variable memory cells may be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell may be determined by sensing current through the cell responsive to an applied interrogation voltage. The sensed current, which varies based on the resistance level of the cell, may indicate the state of the cell.

Various memory arrays may be organized in a cross-point architecture with memory cells (e.g., resistance variable cells) being located at intersections of a first and second signal lines used to access the cells (e.g., at intersections of access lines and sense lines). Some resistance variable memory cells may comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, may comprise a single material which may serve as both a select element and a storage element for the memory cell.

DETAILED DESCRIPTION

The present disclosure includes apparatuses, methods, and systems for multi-state programming of memory cells. An embodiment includes a memory having a plurality of memory cells, and circuitry configured to program a memory cell of the plurality of memory cells to one of four possible data states by applying a first voltage pulse to the memory cell wherein the first voltage pulse has a first polarity and a first magnitude, and applying a second voltage pulse to the memory cell wherein the second voltage pulse has a second polarity and a second magnitude, and the second voltage pulse is applied for a shorter duration than the first voltage pulse.

Embodiments of the present disclosure may provide benefits, such as increased density, reduced cost, increased performance, reduced power consumption, and/or faster and/or more complex operations, as compared to previous memory devices. For example, previous approaches for programming resistance variable memory cells, such as self-selecting memory cells, may be able to generate two different states for the cells, such that the cells may be programmed to one of two possible data states (e.g., state 0 or state 1). However, programming approaches for resistance variable memory cells in accordance with the present disclosure may generate additional (e.g., more than two)

data states for the cells, such that the cells may be programmed to one of at least four possible data states.

As used herein, "a", "an", or "a number of" may refer to one or more of something, and "a plurality of" may refer to two or more such things. For example, a memory device may refer to one or more memory devices, and a plurality of memory devices may refer to two or more memory devices. Additionally, the designators "N" and "M", as used herein, particularly with respect to reference numerals in the drawings, indicates that a number of the particular feature so designated may be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1:
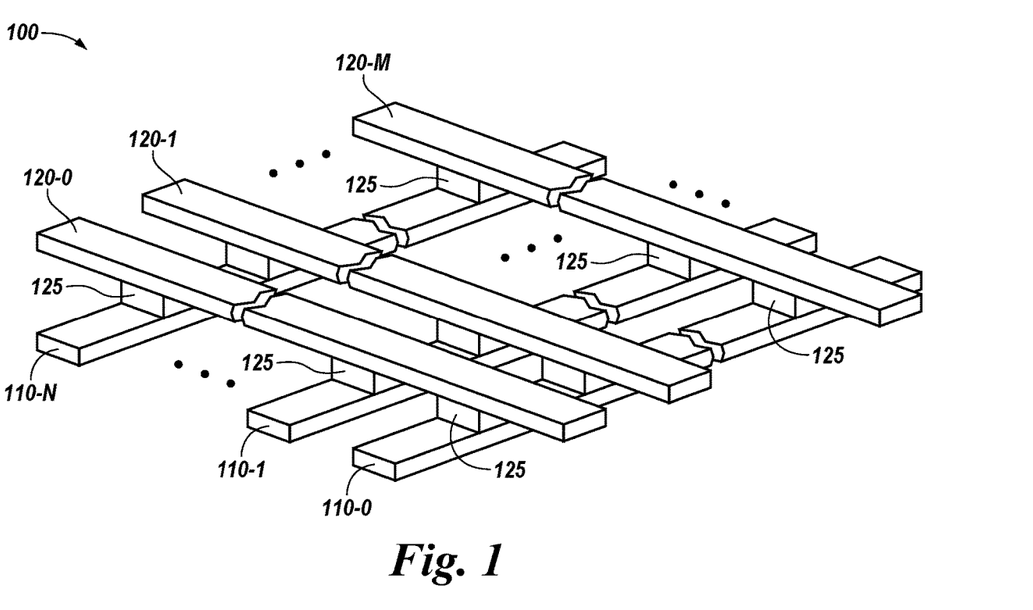
FIG. 1 is a three-dimensional view of an example of a memory array, in accordance with an embodiment of the present disclosure.

FIG. 1 is a three-dimensional view of an example of a memory array 100 (e.g., a cross-point memory array), in accordance with an embodiment of the present disclosure. Memory array 100 may include a plurality of first signal lines (e.g., first conductive lines), which may be referred to as access lines 110-0, 110-1, and 110-N (individually or collectively referred to as access lines 110), and a plurality second signal lines (e.g., second conductive lines), which may be referred to as sense lines 120-0, 120-1, and 120-M (individually or collectively referred to as sense lines 120), that cross each other (e.g., intersect in different planes). For example, each of access lines 110 may cross sense lines 120. A memory cell 125 may be between the sense line 120 and the access line 110 (e.g., at each sense line/access line crossing).

The memory cells 125 may be resistance variable memory cells, for example. The memory cells 125 may include a material programmable to different data states. In some examples, each of memory cells 125 may include a single material that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), a quaternary composition that may include silicon (Si), Se, As, and Ge, etc.

The architecture of memory array 100 may be referred to as a cross-point architecture in which a memory cell is formed at a topological cross-point between an access line and a sense line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures. In some architectures (not shown), a plurality of access lines may be formed on parallel planes or tiers parallel to a substrate. The plurality of access lines may be configured to include a plurality of holes to allow a plurality of sense lines formed orthogonally to the planes of access lines such that each of the plurality of sense lines penetrates through a vertically aligned set of holes (e.g., the sense lines vertically disposed with respect to the planes of access lines and the horizontal substrate). Memory cells including storage element (e.g., self-selecting memory cells including a chalcogenide material) may be formed at the crossings of access lines and sense lines (e.g., spaces between the access lines and the sense lines in the vertically aligned set of holes). In a similar fashion as described above with reference to FIG. 1, the memory cells (e.g., self-selecting memory cells including a chalcogenide material) may be operated (e.g., read and/or programmed) by selecting respective conductive lines (e.g., a sense line and an access line) and applying voltage or current pulses.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

Figure 2A:
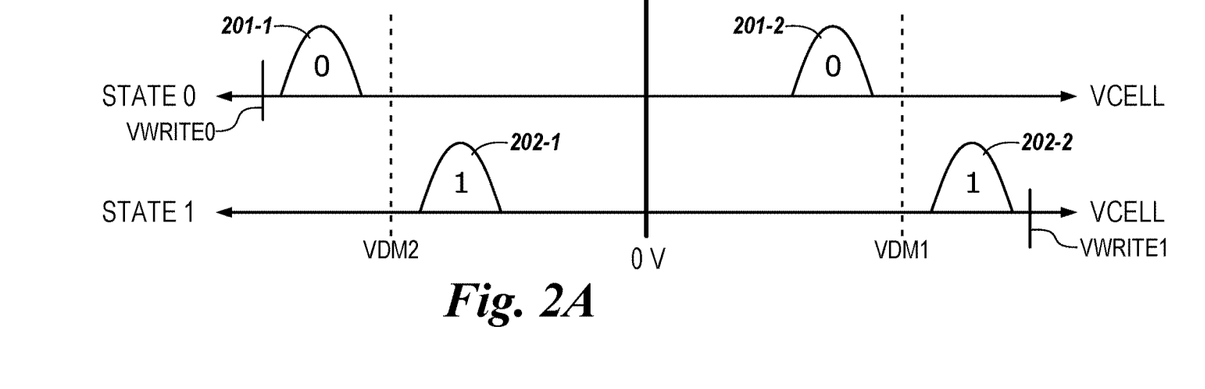
FIG. 2A illustrates threshold voltage distributions associated with memory states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells may be programmed to one of at least two possible data states (e.g., state 0 and state 1). That is, FIG. 2A illustrates threshold voltage distributions associated with two of the four possible data states to which the memory cells may be programmed.

In FIG. 2A, the voltage VCELL may correspond to a voltage differential applied to (e.g., across) the memory cell, such as the difference between a sense line voltage (e.g., bit line voltage (VBL)) and an access line voltage (e.g., word line voltage (VWL)) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
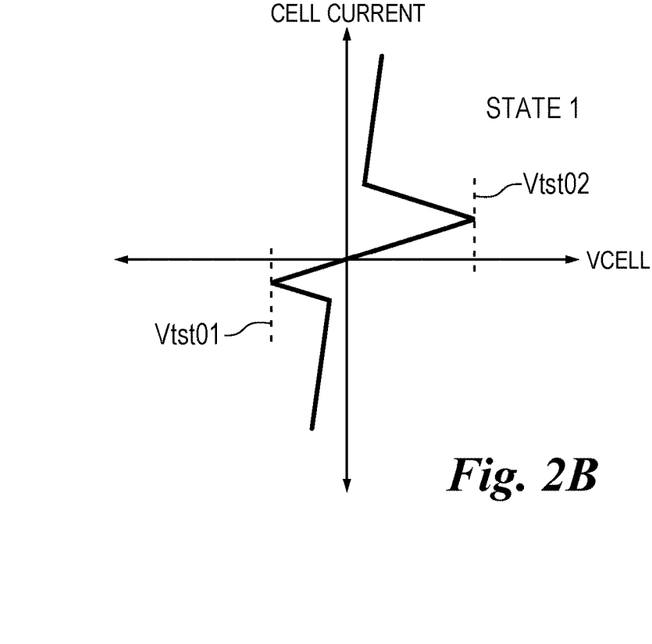
FIG. 2B is an example of a current-versus-voltage curve corresponding to a memory state of FIG. 2A, in accordance with an embodiment of the present disclosure.
Figure 2C:
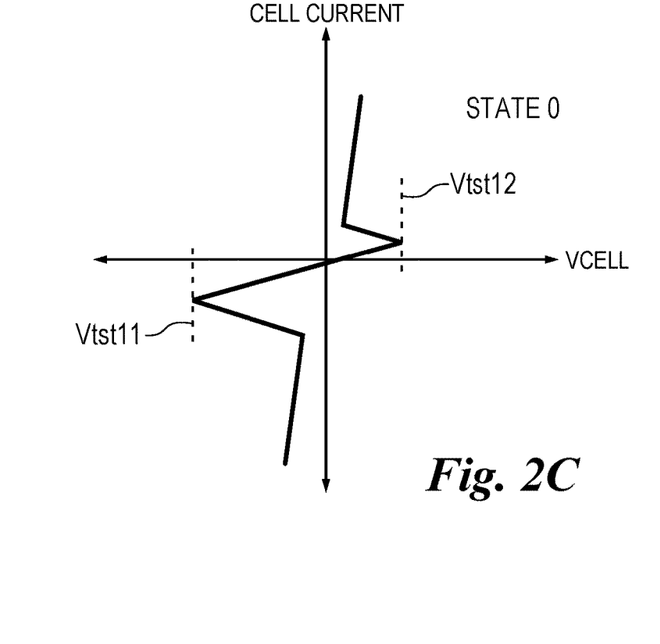
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back may be different (e.g., higher or lower) for one applied voltage polarity than the other.

FIG. 2A illustrates demarcation voltages VDM1 and VDM2, which may be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 may be interchanged (e.g., distributions 201-1 and 201-2 may be designated as state 1 and distributions 202-1 and 202-2 may be designated as state 0). Further, embodiments may include more than two possible data states to which a memory cell may be programmed, as will be further described herein (e.g., in connection with FIGS. 3-5).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation may be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL may represent an applied voltage across the memory cell. For example, VCELL may be a voltage applied to a top electrode corresponding to the cell minus a voltage applied to a bottom electrode corresponding to the cell (e.g., via a respective access line and sense line). As shown in FIG. 2B, responsive to an applied positive polarity voltage (VCELL), a memory cell programmed to state 1 (e.g., threshold voltage distribution 202-2) is in a non-conductive state until VCELL reaches voltage Vtst02, at which point the cell transitions to a conductive (e.g., lower resistance) state. This transition may be referred to as a snapback event, which occurs when the voltage applied across the cell (in a particular polarity) exceeds the cell's threshold voltage. Accordingly, voltage Vtst02 may be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event may result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event may be used to write a cell to the opposite state (e.g., from state 1 to state 0 and vice versa).

In an embodiment of the present disclosure, a memory cell, such as memory cells 125 illustrated in FIG. 1, may be programmed to one of four possible data states (e.g., state 0, state 1, or one of two additional possible data states as will be further described herein) by applying one or more voltage pulses to the memory cell. For example, the memory cell can be programmed by applying a first voltage pulse and a second voltage pulse to the cell. The first voltage pulse can have a first polarity, a first magnitude, and a first duration, and the second voltage pulse can have a second (e.g., opposite) polarity, a second (e.g., lower) magnitude, and a second (e.g., shorter) duration. Examples of such voltage pulses will be further described herein (e.g., in connection with FIGS. 3A-3D).

Figure 3A:
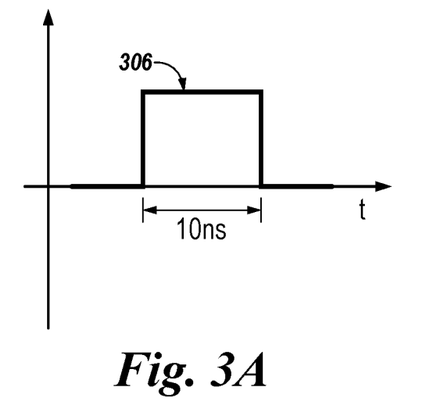
FIGS. 3A-3D illustrates voltage pulses to program a memory cell to one of multiple possible data states in accordance with an embodiment of the present disclosure.
Figure 3B:
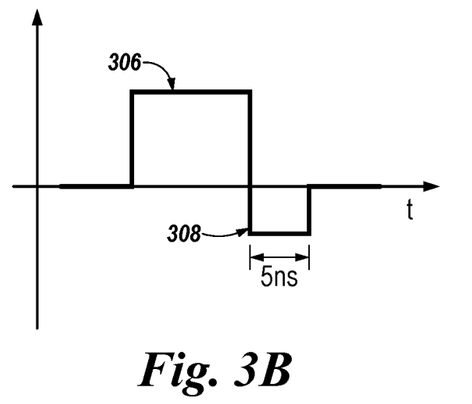
Figure 3C:
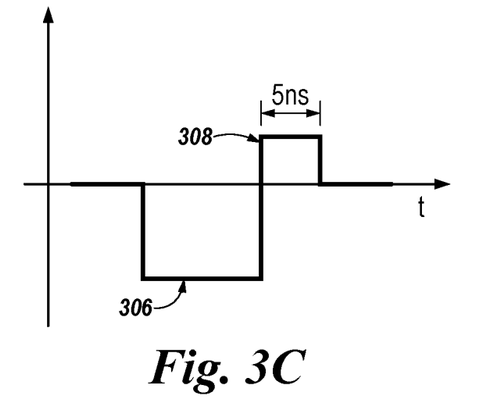
Figure 3D:
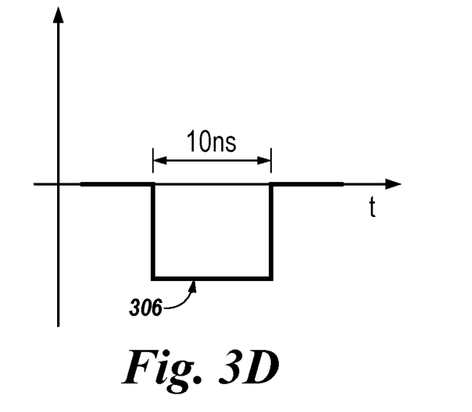

FIGS. 3A-D illustrate voltage pulses to program a memory cell to one of multiple possible data states in accordance with an embodiment of the present disclosure. For example, applying a first voltage pulse 306 in a positive polarity, as illustrated in FIG. 3A, to a memory cell may program the memory cell to a first data state. Applying the first voltage pulse 306 in the positive polarity, and then applying a second voltage pulse 308 in a negative polarity, as illustrated in FIG. 3B, may program the memory cell to a second data state. Applying the first voltage pulse 306 in a negative polarity to the memory cell, as illustrated in FIG. 3D, may program the memory cell to a fourth data state. Applying the first voltage pulse 306 in the negative polarity, and then applying the second voltage pulse 308 in a positive polarity to the memory cell, as illustrated in FIG. 3C, may program the memory cell to a third data state.

In some embodiments, the second voltage pulse 308 may have a magnitude that is less than the magnitude of the first voltage pulse 306, as illustrated in FIGS. 3B and 3C. For example, the first voltage pulse 306 may have a magnitude in a range of 4.5-6.5 Volts (V) and the second voltage pulse 308 may have a magnitude in a range of 3.5-5.5 V. Further, for example, the second voltage pulse 308 may have a magnitude that is 70%-80% of the magnitude of the first voltage pulse 306. In some embodiments, the first voltage pulse 306 may be applied to the memory cell for a longer amount of time than the second voltage pulse 308. For example, a first voltage pulse 306 may be applied to the memory cell for 10 nanoseconds (ns) and the second voltage pulse 308 may be applied to the memory cell for 5 ns. Further, for example, the duration in which the second voltage pulse 308 is applied to the memory cell may be less than 50% of the duration in which the first voltage pulse 306 is applied to the memory cell.

The second voltage pulse 308 may be applied to the memory cell after the first voltage pulse 306 is applied to the memory cell, as illustrated in FIGS. 3B and 3C. In some embodiments, the second voltage pulse 308 may be applied to the memory cell immediately after the first voltage pulse 306 is applied to the memory cell. In some embodiments, the second voltage pulse 308 may be applied to the memory cell a particular amount of time after the first voltage pulse 306 is applied to the memory cell. For example, the second voltage pulse 308 may be applied to the memory cell less than 5 ns after the first voltage pulse 306 is applied to the memory cell.

Applying a first voltage pulse 306 in a positive polarity to the memory cell may program the memory cell to a first data state, as illustrated in FIG. 3A, and applying the first voltage pulse 306 in a negative polarity may program the memory cell to a fourth data state, as illustrated in FIG. 3D. Applying the second voltage pulse 308 in a negative polarity after applying the first voltage pulse 306 in a positive polarity, as illustrated in FIG. 3B, may program the memory cell to a second data state. Applying the second voltage pulse 308 in a positive polarity to the memory cell after applying the first voltage pulse 306 in a negative polarity to the memory cell, as illustrated in FIG. 3C, may program the memory cell to a third data state. Therefore, the memory cell may be programmed to a second data state after the memory cell is programmed to a first data state. Further, the memory cell may be programmed to a third data state after the memory cell is programmed to a fourth data state.

Figure 4:
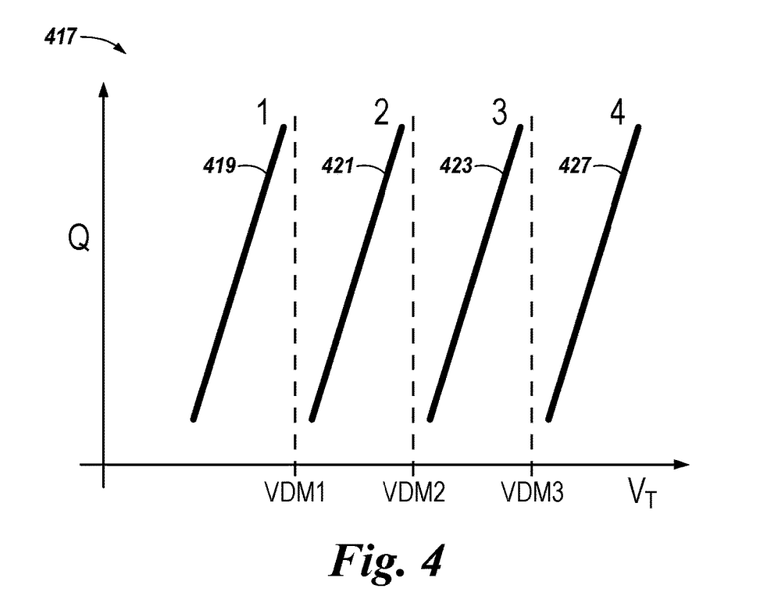
FIG. 4 is a graph illustrating threshold voltage distributions associated with data states of memory cells, in accordance with an embodiment of the present disclosure.

FIG. 4 is a graph 417 illustrating threshold voltage distributions associated with data states of memory cells, in accordance with an embodiment of the present disclosure. The threshold voltage distributions illustrated in FIG. 4 may be associated with (e.g., correspond to) the four possible data states to which the memory cell may be programmed using the voltage pulses described in connection with FIGS. 3A-3D. For example, threshold voltage distribution 419 may correspond to the first data state, threshold voltage distribution 421 may correspond to the second data state, threshold voltage distribution 423 may correspond to the third data state, and threshold voltage distribution 427 may correspond to the fourth data state.

Applying a first voltage pulse (e.g., first voltage pulse 306 described in connection with FIGS. 3A-3D) to a memory cell may program the memory cell to one of two of the four possible data states. For example, applying the first voltage pulse to the memory cell may program the memory cell to a first data state corresponding to the threshold voltage distribution 419 (e.g., if the first voltage pulse has a positive polarity) or a fourth data state corresponding to the threshold voltage distribution 427 (e.g., if the fourth voltage pulse has a negative polarity). Applying the second voltage pulse (e.g., second voltage pulse 308 described in connection with FIGS. 3B-3C) to the memory cell may program the memory cell to one of two of the four possible data states. For example, applying the second voltage pulse to the memory cell may program the memory cell to a second data state corresponding to the threshold voltage distribution 421 (e.g., if the second voltage pulse has a negative polarity) or a third data state corresponding to the threshold voltage distribution 423 (e.g., if the second voltage pulse has a positive polarity).

Applying the voltage pulses to a memory cell as described herein may allow for the memory cell to be programmed to a desired data state. In some embodiments, applying the second voltage pulse in the opposite polarity of the first voltage pulse may modify the polarization effects of the first voltage pulse and create intermediate data states (e.g., the second data state and the third data state). Modifying the duration in which the second voltage pulse is applied to the memory cell may modify the distance between the threshold voltage distributions associated with the data states of the memory cell. For example, decreasing the duration for which the second voltage pulse is applied to the memory cell may decrease a difference between a threshold voltage distribution associated with a first of the four possible data states and the threshold distribution associated with a second of the four possible data states. Increasing the duration for which the second voltage pulse is applied to the memory cell may increase the difference between a threshold voltage distribution associated with a first of the four possible data states and a threshold voltage distribution associated with a second of the four possible data states. In some embodiments, the polarity in which the first voltage pulse and the second voltage pulse is applied may determine which threshold voltage's placement is affected by modifying the duration in which the second voltage pulse is applied. For example, modifying the duration in which a second voltage pulse in a negative polarity is applied to the memory cell may affect the distance between the threshold voltage distributions of the first data state and the second data state. Modifying the duration in which the second voltage pulse in a positive polarity is applied to the memory cell may affect the distance between the threshold voltage distributions of the third data state and the fourth data state.

VDM1, VDM2, and VDM3 shown in FIG. 4 may be used to distinguish between the different data states when sensing (e.g., reading) the threshold voltage of the memory cell. For example, VDM1 may be used to distinguish between threshold voltages within threshold voltage distributions 419 and 421, corresponding to the first and second data states, respectively. VDM2 may be used to distinguish between threshold voltages within threshold voltage distributions 421 and 423, corresponding to the second and third data states, respectively. VDM3 may be used to distinguish between threshold voltages within threshold voltage distributions 423 and 427, corresponding to the third and fourth data states, respectively.

In some embodiments, the magnitude of a threshold voltage distribution associated with a first of the four possible data states may be greater than the magnitude of a threshold voltage distribution associated with a second of the four possible data states. For example, the magnitude of the threshold voltage distribution associated with the second data state may be greater than the magnitude of the threshold voltage distribution associated with the first data state. The memory cell may be programmed to the second data state after a second voltage pulse is applied to the memory cell in an opposite polarity than the first voltage pulse. Applying the second voltage pulse in the opposite polarity to the memory cell may increase the magnitude of the threshold voltage of the memory cell. Further, the magnitude of the threshold voltage distribution associated with the third data state may be less than the magnitude of the threshold voltage distribution associated with the fourth data state. The memory cell may be programmed to the third data state after being programmed to the fourth data state. Applying the second voltage pulse in the opposite polarity to the memory cell may decrease the magnitude of the threshold voltage of the memory cell. In some embodiments, the magnitude of the threshold voltage distribution associated with the second data state may be greater than the magnitude of the threshold voltage distribution associated with the first data state but less than the magnitude of the threshold voltage distribution associated with the third data state. Further, the magnitude of the threshold voltage associated with the third data state may be less than the magnitude of the threshold voltage distribution associated with the fourth data state.

Figure 5A:
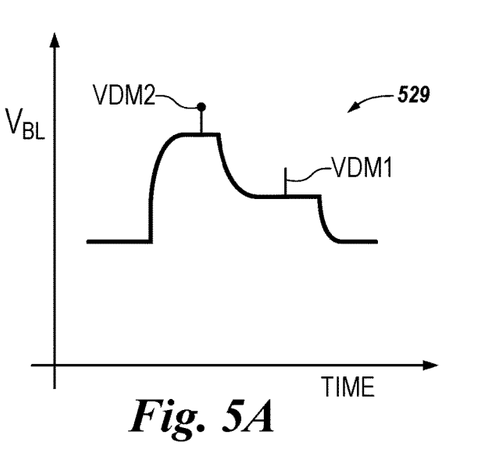
FIG. 5A is a graph illustrating a sense line voltage when the data state of a memory cell that is coupled to the sense line is being sensed in accordance with an embodiment of the present disclosure.

FIG. 5A is a graph 529 illustrating a sense (e.g., bit) line voltage when the data state of a memory cell that is coupled to the sense line is being sensed (e.g., read) in accordance with an embodiment of the present disclosure. For example, graph 529 illustrates the sense line voltage 536 when a snapback (e.g., snapback event) is detected in the memory cell during the sensing.

As described in connection with FIGS. 2A-2C, a snapback event may occur when a voltage exceeding the threshold voltage of the memory cell is applied to the memory cell and causes the memory cell to snap back from a high impedance non-conductive state to a lower impedance conductive state. VDM2, which may be VDM2 illustrated in FIG. 4, may be applied to the memory cell to determine whether a snapback event has occurred in the memory cell. Once the snapback event has been detected, VDM1, which may be VDM1 illustrated in FIG. 4, may be applied to the sense line to determine the data state of the memory cell. In some embodiments, since a snapback event was detected, the memory cell may be programmed to either the first data state or the second data state. VDM1 may be used to sense the magnitude of the threshold voltage of the memory cell to determine whether the memory cell is programmed to the first or second data state.

Figure 5B:
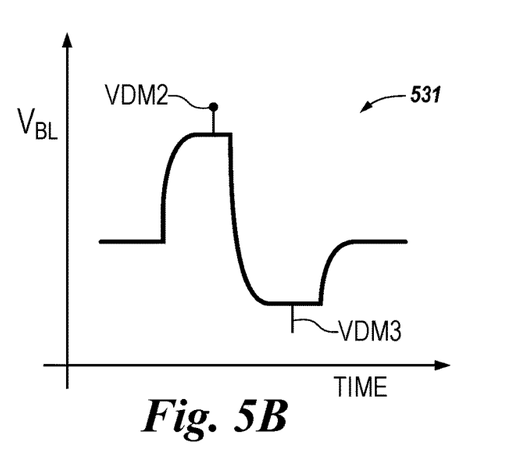
FIG. 5B is a graph illustrating a sense line voltage when the data state of a memory cell that is coupled to the sense line is being sensed in accordance with an embodiment of the present disclosure.

FIG. 5B is a graph 531 illustrating a sense line voltage when the data state of a memory cell that is coupled to the sense line is being sensed in accordance with an embodiment of the present disclosure. For example, graph 531 illustrates a sense line voltage 538 when a snapback event is not detected in the memory cell during the sensing.

As described in connection with FIG. 5A, VDM2 may be applied to the memory cell to detect whether a snapback event has occurred in the memory cell. In some embodiments, if a snapback event has not occurred, the memory cell may be programmed to either the third data state or the fourth data state. VDM3, which may be VDM3 illustrated in FIG. 4, may be applied to the sense line to determine whether the memory cell has been programmed to the third or fourth data state. For example, VDM3 may be used to sense a magnitude of the threshold voltage of the memory cell to determine whether the memory cell has been programmed to the third or fourth data state.

Figure 6:
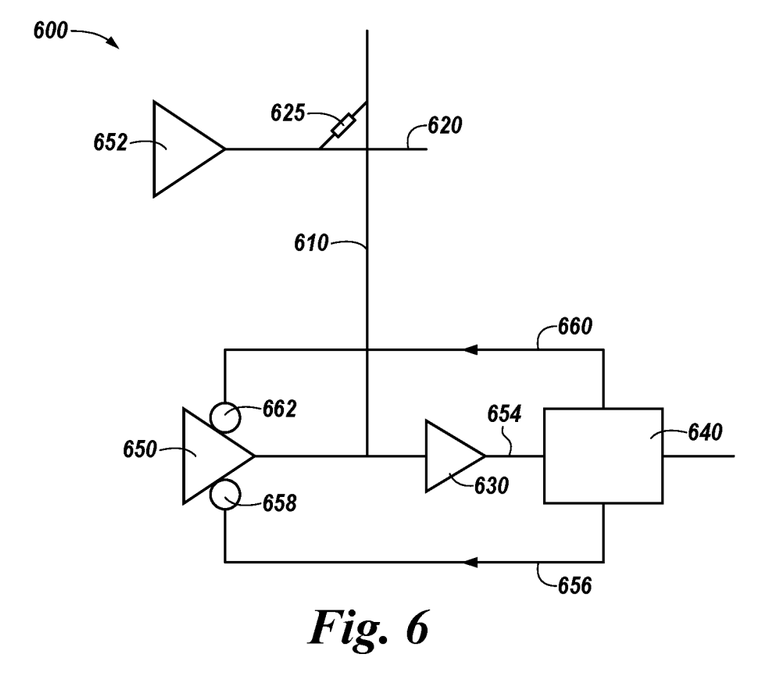
FIG. 6 illustrates an example of a portion of a memory array and associated circuitry, in accordance with an embodiment of the present disclosure.

FIG. 6 illustrates an example of a portion of a memory array 600 and associated circuitry for detecting snapback events in accordance with an embodiment of the present disclosure. Memory array 600 may be a portion of memory array 100 previously described in connection with FIG. 1. Memory cell 625 is coupled to an access line 610 and a sense line 620 and may be operated as described herein.

The example shown in FIG. 6 incldes a driver 650 (e.g., an access line driver 650) coupled to access line 610. Access line driver 650 may supply bi-polar (e.g., positive and negative) current and/or voltage signals to access line 610. A sense amplifier 630, which may comprise a cross-coupled latch, is coupled to access line driver 650, and may detect positive and negative currents and/or positive and negative voltages on access line 610. In some examples, sense amplifier 630 may be part of (e.g., included in) access line driver 650. For example, the access line driver 650 may include the sensing functionality of sense amplifier 630. A sense line driver 652 is coupled to sense line 620 to supply positive and/or negative current and/or voltage signals to sense line 620.

The sense amplifier 630 and access line driver 650 are coupled to a latch 640, which may be used to store a data value indicating whether or not a snapback event of cell 625 has occurred responsive to an applied voltage differential. For instance, an output signal 654 of sense amplifier 630 is coupled to latch 640 such that responsive to detection, via sense amplifier 630, of memory cell 625 snapping back, the output signal 654 causes the appropriate data value to be latched in latch 640 (e.g., a data value of "1" or "0" depending on which data value is used to indicate a detected snapback event). As an example, if a latched data value of "1" is used to indicate a detected snapback event, then signal 654 will cause latch 640 to latch a data value of logical 1 responsive to a detected snapback of cell 625, and vice versa.

When a positive voltage differential VDM1 is applied to memory cell 625 (e.g., the word line voltage VWL1 is low and the bit line voltage VBL1 is high) and memory cell 625 stores state 0, voltage differential VDM1 may be greater than the threshold voltage Vtst12 (FIG. 2C), and memory cell 625 may snap back to a conductive state, causing the positive current flow, shown in FIG. 2C, through memory cell 625 from sense line 620 to access line 610. Sense amplifier 630 may detect this current, and/or a voltage associated therewith, for example, and may output signal 654 to latch 640 in response to detecting this current and/or voltage. For example, signal 654 may indicate to latch 640 (e.g., by having a logical high value) that current is positive, and thus that access line (e.g., word line) voltage is high. In response to the signal 654 indicating that the word line voltage is high, latch 640 may output a signal 656 (e.g. voltage) to circuitry 658 of, or coupled to, access line driver 650 that turns off (e.g., inhibits) the current flow through access line 610, and thus through memory cell 625.

In examples, when a negative voltage differential VDM2 is applied to memory cell 625 (e.g., the word line voltage VWL2 is high and the bit line voltage VBL2 is low) and memory cell 625 stores state 1, voltage differential VDM2 is greater (in a negative sense) than the threshold voltage Vtst01 (FIG. 2B), and memory cell 625 may snap back to a conductive state, causing the negative current flow, shown in FIG. 2B, through memory cell 625 from access line 610 to sense line 620. Sense amplifier 630 may detect this current, and/or a voltage associated therewith, for example, and may output the signal 654 to latch 640 in response to detecting this current and/or a voltage. For example, signal 654 may indicate to latch 640 that current is negative (e.g., by having a logical low value), and thus that the word line voltage is low. In response to the signal 654 indicating that the word line voltage is low, latch 640 may output a signal 660 (e.g. voltage) to circuitry 662 of, or coupled to, access line driver 650 that turns off the current flow through access line 610. In some examples, sense amplifier 630 in combination with circuitries 658 and 662 may be referred to as detection circuitry.

Figure 7:
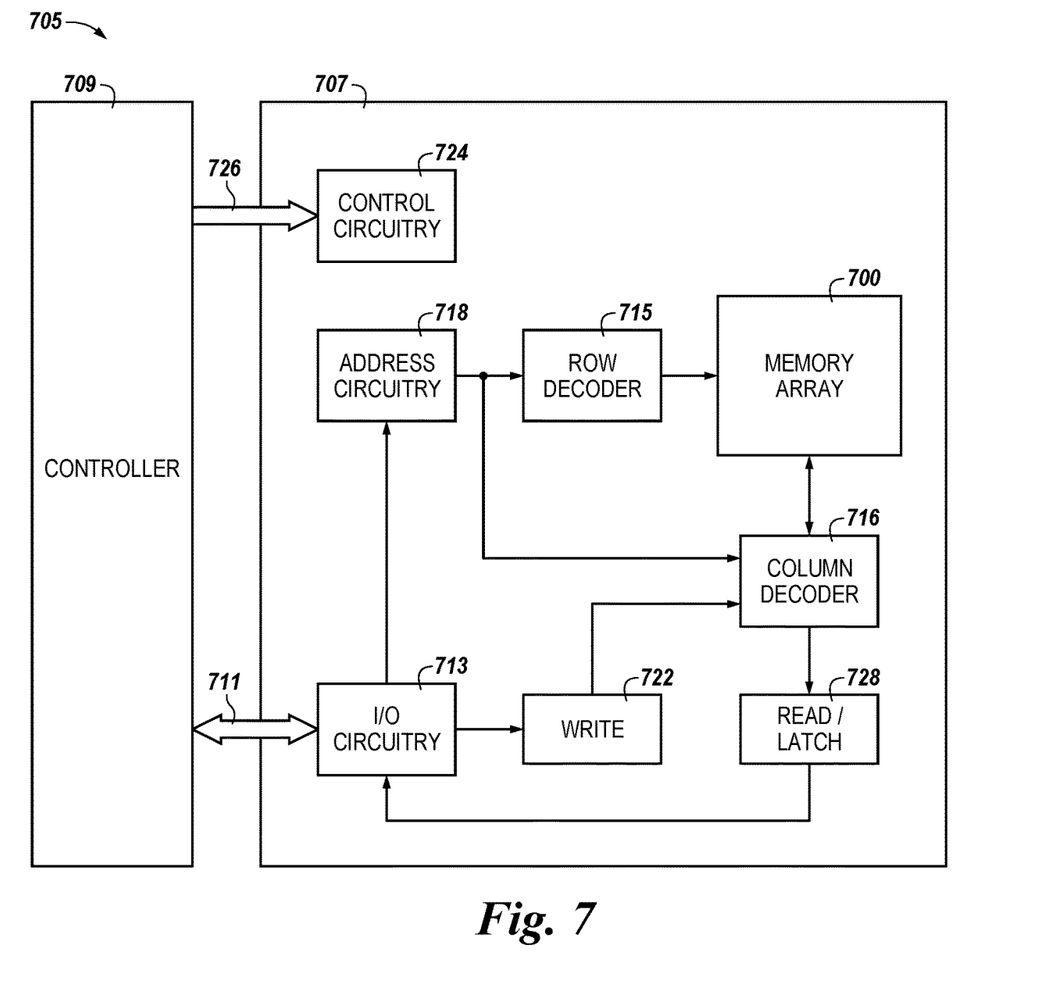
FIG. 7 is a block diagram illustration of an example apparatus, in accordance with an embodiment of the present disclosure.

FIG. 7 is a block diagram illustration of an example apparatus, such as an electronic memory system 705, in accordance with an embodiment of the present disclosure. Memory system 705 includes an apparatus, such as a memory device 707, and a controller 709, such as a memory controller (e.g., a host controller). Controller 709 might include a processor, for example. Controller 709 might be coupled to a host, for example, and may receive command signals (or commands), address signals (or addresses), and data signals (or data) from the host and may output data to the host.

Memory device 707 includes a memory array 700 of memory cells. For example, memory array 700 may include one or more of the memory arrays, such as a cross-point array, of memory cells disclosed herein.

Memory device 707 includes address circuitry 718 to latch address signals provided over I/O connections 711 through I/O circuitry 713. Address signals are received and decoded by a row decoder 715 and a column decoder 716 to access the memory array 700. For example, row decoder 715 and/or column decoder 716 may include drivers, such as drivers 650 and 652 as previously described in conjunction with FIG. 6.

Memory device 707 may sense (e.g., read) data in memory array 700 by sensing voltage and/or current changes in the memory array columns using sense/buffer circuitry that in some examples may be read/latch circuitry 728. Read/latch circuitry 728 may read and latch data from the memory array 700. I/O circuitry 713 is included for bi-directional data communication over the I/O connections 711 with controller 709. Write circuitry 722 is included to write data to memory array 700.

Control circuitry 724 may decode signals provided by control connections 726 from controller 709. These signals may include chip signals, write enable signals, and address latch signals that are used to control the operations on memory array 700, including data read and data write operations.

Control circuitry 724 may be included in controller 709, for example. Controller 709 may include other circuitry, firmware, software, or the like, whether alone or in combination. Controller 709 may be an external controller (e.g., in a separate die from the memory array 700, whether wholly or in part) or an internal controller (e.g., included in a same die as the memory array 700). For example, an internal controller might be a state machine or a memory sequencer.

In some examples, controller 709 may be configured to cause memory device 707 to at least perform the methods disclosed herein, such as programming the memory cells of array 700 to one of a plurality of possible data states. In some examples, memory device 707 may include the circuitry previously described in conjunction with FIG. 6. For example, memory device 707 may include the sense amplifier circuitry and latches, such as sense amplifiers 630 and latch 640 disclosed herein.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals may be provided, and that the memory system 705 of FIG. 7 has been simplified. It should be recognized that the functionality of the various block components described with reference to FIG. 7 may not necessarily be segregated to distinct components or component portions of an integrated circuit device. For example, a single component or component portion of an integrated circuit device could be adapted to perform the functionality of more than one block component of FIG. 7. Alternatively, one or more components or component portions of an integrated circuit device could be combined to perform the functionality of a single block component of FIG. 7.

Although specific embodiments have been illustrated and described herein, those of ordinary skill in the art will appreciate that an arrangement calculated to achieve the same results may be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory; and
circuitry configured to program a memory cell of the memory to one of four possible data states by:
applying a first voltage pulse to the memory cell, wherein the first voltage pulse has a first polarity; and
applying a second voltage pulse to the memory cell, wherein:
the second voltage pulse has a second polarity; and
the second voltage pulse is applied for a shorter duration than the first voltage pulse; and
wherein a magnitude of a threshold voltage distribution associated with a first one of the four possible data states is less than a magnitude of a threshold voltage distribution associated with a second one of the four possible data states.

2. The apparatus of claim 1, wherein the first polarity is one of a positive polarity or a negative polarity and the second polarity is the other one of the positive polarity or the negative polarity.

3. The apparatus of claim 2, wherein the memory cell is programmed to the first one of the four possible data states when the first voltage pulse has the positive polarity.

4. The apparatus of claim 2, wherein the memory cell is programmed to the second one of the four possible data states when the first voltage pulse has the positive polarity and the second voltage pulse has the negative polarity.

5. The apparatus of claim 2, wherein the memory cell is programmed to a third one of the four possible data states when the first voltage pulse has the negative polarity and the second voltage pulse has the positive polarity.

6. The apparatus of claim 2, wherein the memory cell is programmed to a fourth one of the four possible data states when the first voltage pulse has the negative polarity.

7. The apparatus of claim 1, wherein each of the four possible data states corresponds to a different threshold voltage distribution.

8. The apparatus of claim 1, wherein a magnitude of a threshold voltage distribution associated with a third one of the four possible data states is less than a magnitude of a threshold voltage distribution associated with a fourth one of the four possible data states.

9. The apparatus of claim 8, wherein a difference between the threshold voltage distribution associated with the first one of the four possible data states and the threshold voltage distribution associated with the fourth one of the four possible data states is greater than a difference between the threshold voltage distribution associated with the second one of the four possible data states and the threshold voltage distribution associated with the third one of the four possible data states.

10. The apparatus of claim 1, wherein a magnitude of a threshold voltage of the memory cell increases when the second voltage pulse is applied to the memory cell.

11. An apparatus, comprising:
a memory; and
circuitry configured to program a memory cell of the memory to one of four possible data states by:
applying a first voltage pulse to the memory cell, wherein the first voltage pulse has a first magnitude; and
applying a second voltage pulse to the memory cell, wherein:
the second voltage pulse has a second magnitude that is less than the first magnitude; and
the second voltage pulse is applied for a shorter duration than the first voltage pulse.

12. The apparatus of claim 11, wherein the first voltage pulse is applied for twice the duration of the second voltage pulse.

13. The apparatus of claim 11, wherein the first magnitude of the first voltage pulse is in a first range of voltage magnitudes that is greater than a second range of voltage magnitudes in which the second magnitude of the second voltage pulse is in.

14. The apparatus of claim 13, wherein a minimum voltage magnitude of the first range of voltage magnitudes is less than a maximum voltage magnitude of the second range of voltage values.

15. The apparatus of claim 11, wherein the second magnitude is at least 50% of the first magnitude.

16. A method, comprising:
programming a memory cell to one of four possible data states by:
applying a first voltage pulse to the memory cell, wherein the first voltage pulse has a first polarity and a first magnitude; and
applying a second voltage pulse to the memory cell, wherein:
the second voltage pulse has a second polarity and a second magnitude; and
the first magnitude is a different magnitude than the second magnitude.

17. The method of claim 16, wherein the memory cell is programmed to a first one of the four possible data states or a fourth one of the four possible data states after the first voltage pulse is applied to the memory cell and before the second voltage pulse is applied to the memory cell.

18. The method of claim 16, wherein the memory cell is programmed to a second one of the four possible data states or a third one of the four possible data states after the first voltage pulse and the second voltage pulse are applied to the memory cell.

* * * * *